(12) United States Patent  (10) Patent No.: US 7,760,500 B2
Gwin et al.  (45) Date of Patent: Jul. 20, 2010

(54) LIQUID COOLING SYSTEM

(75) Inventors: Paul J. Gwin, Orangevale, CA (US); Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 12/047,026

(22) Filed: Mar. 12, 2008

(65) Prior Publication Data

US 2008/0283218 A1 Nov. 20, 2008

Related U.S. Application Data

(60) Division of application No. 10/940,190, filed on Sep. 14, 2004, now abandoned, which is a continuation-in-part of application No. 10/749,732, filed on Dec. 30, 2003, now Pat. No. 7,046,517.

(51) Int. Cl.
*H05K 7/20* (2006.01)
*G06F 1/20* (2006.01)
*F28F 7/00* (2006.01)

(52) U.S. Cl. ............. 361/696; 361/679.47; 361/679.53; 361/695; 361/699; 361/701; 165/77; 165/80.4; 165/104.33

(58) Field of Classification Search ................. 361/610, 361/679.46–679.54, 688, 694–696, 699, 361/701; 165/66, 77, 80.4, 104.33; 24/458; 248/27.3; 312/223.1, 223.2; 454/184
See application file for complete search history.

(56) References Cited

U.S. PATENT DOCUMENTS

| 4,696,361 A | 9/1987 | Clark |
| 5,035,281 A | 7/1991 | Neuenfeldt et al. |
| 5,172,305 A | 12/1992 | DeWilde |
| 5,561,893 A | 10/1996 | Lee |
| 5,572,402 A | 11/1996 | Jeong |
| 5,745,342 A | 4/1998 | Jeffries et al. |
| 5,808,864 A | 9/1998 | Jung |
| 5,995,364 A | 11/1999 | McAnally |
| 6,040,981 A | 3/2000 | Schmitt |
| 6,215,664 B1 | 4/2001 | Hernandez |
| 6,272,009 B1 | 8/2001 | Buican |
| 6,349,029 B1 | 2/2002 | Leman |
| 6,353,541 B1 | 3/2002 | Leman |
| 6,356,438 B1 | 3/2002 | Leman |
| 6,386,656 B1 | 5/2002 | Chen |
| 6,404,642 B1 | 6/2002 | Greenfield |
| 6,430,041 B1 | 8/2002 | Johnson |
| 6,445,576 B1 | 9/2002 | Wooden |
| 6,504,719 B2 | 1/2003 | Konstad |
| 6,507,487 B1 | 1/2003 | Barina |

(Continued)

FOREIGN PATENT DOCUMENTS

TW 362783 6/1999

*Primary Examiner*—Jayprakash N Gandhi
*Assistant Examiner*—Robert J Hoffberg
(74) *Attorney, Agent, or Firm*—Robert D. Anderson

(57) ABSTRACT

In some embodiments, a cooling device may be mounted to a portion of a chassis of an electronic system, wherein the cooling device may be releasably and pivotably attached to the chassis in at least an open position to permit access to components within the electronic system and a closed position to permit installation of a cover on the chassis. Other embodiments are disclosed and claimed.

12 Claims, 15 Drawing Sheets

U.S. PATENT DOCUMENTS

| | | |
|---|---|---|
| 6,587,343 B2 | 7/2003 | Novotny et al. |
| 6,648,088 B2 * | 11/2003 | Gabioli ..................... 180/68.4 |
| 6,711,015 B2 | 3/2004 | Syring |
| 6,749,012 B2 | 6/2004 | Gwin |
| 6,751,100 B2 | 6/2004 | Chen |
| 6,757,167 B2 | 6/2004 | Page et al. |
| 6,781,827 B2 | 8/2004 | Goodman |
| 6,809,928 B2 | 10/2004 | Gwin |
| 7,046,517 B2 | 5/2006 | Long |
| 7,149,084 B2 | 12/2006 | Matsushima et al. |
| 7,370,690 B2 * | 5/2008 | Rasset et al. ................... 165/41 |
| 2006/0067052 A1 * | 3/2006 | Llapitan et al. ............. 361/700 |

* cited by examiner

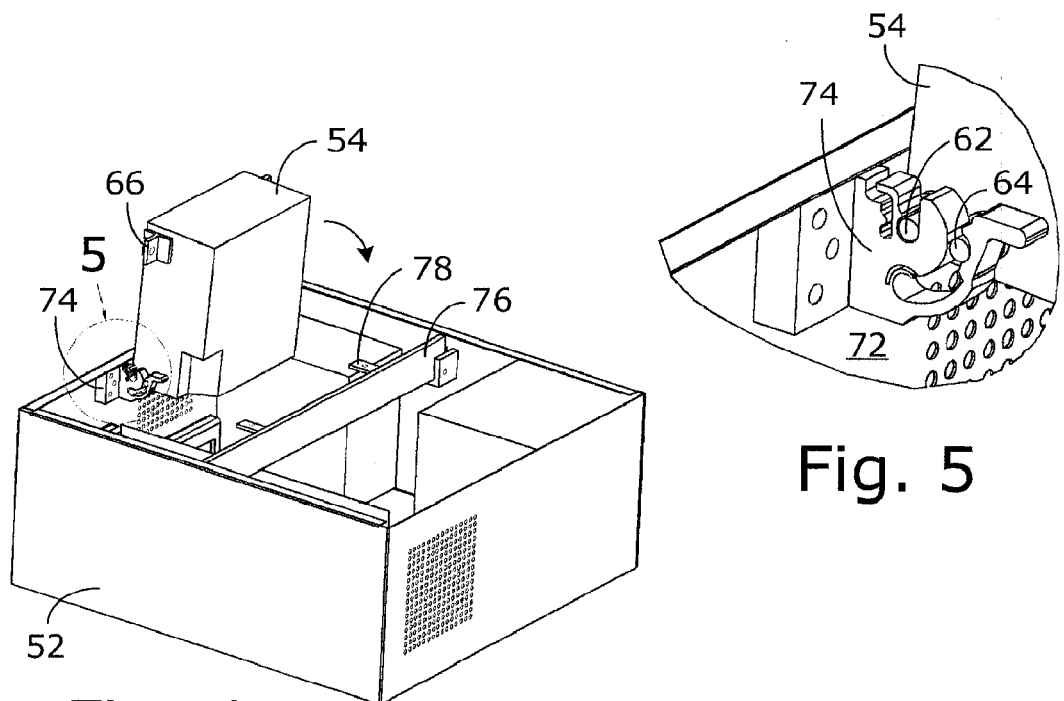
Fig. 5
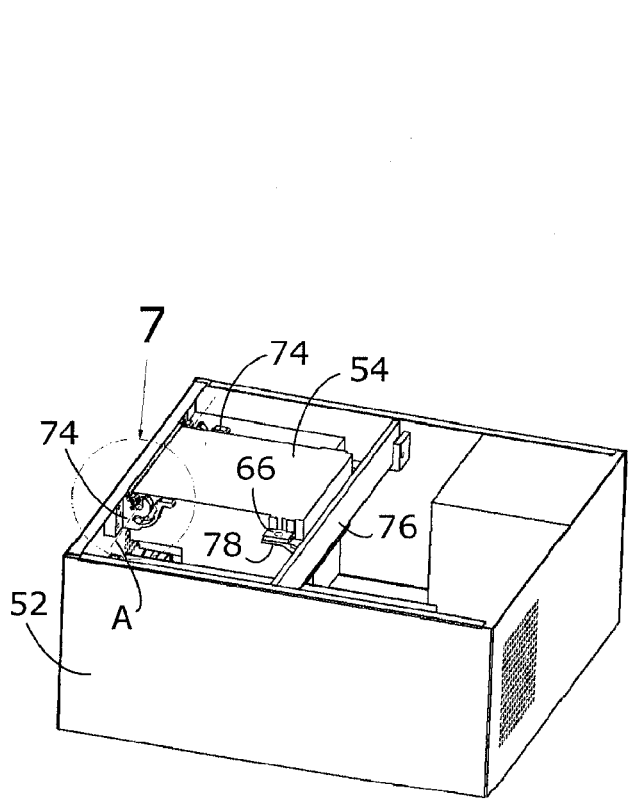
Fig. 4
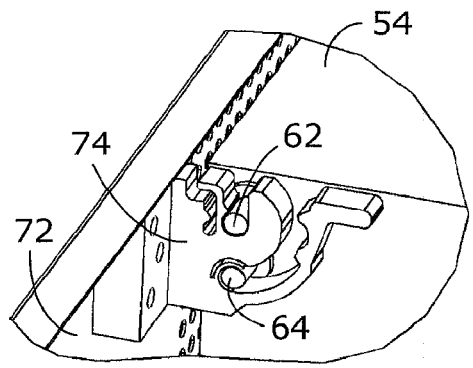
Fig. 7
Fig. 6

LIQUID COOLING SYSTEM

This application is a divisional of co-pending U.S. patent application Ser. No. 10/940,190, which was a continuation-in-part of U.S. patent application Ser. No. 10/749,732, filed Dec. 30, 2003, entitled Electrically Isolated Semi-Lock Hinge for Cooling System, now U.S. Pat. No. 7,046,517.

The invention relates to liquid cooling systems and more particularly to liquid cooling systems for electronic components, and methods related thereto.

BACKGROUND AND RELATED ART

A liquid cooling system is described in U.S. Pat. No. 6,749,012, assigned in common with the present application. Referring to FIG. 1, a liquid cooling system 10 for a processor-based system may include a housing 12 that houses a heat exchanger core 36 and a liquid pump (not shown in FIG. 1). Secured to the housing 12 is a fan assembly 26 including a fan 14. The fan 14 is positioned over an opening in the housing 12 to provide air cooling of liquid inside a heat exchanger core 36. The heat exchanger core 36 is defined in part by opposed faces separated a given amount to define a thickness direction. The fan 14 may be coupled to an electrical potential through a connector 18. The liquid pump may be coupled to an electrical potential through a connector 16. A portion 28 of the housing 12 may comprise a tank or reservoir for the pumped, cooling liquid.

The cooled liquid, passing out of the housing 12, may pass through a pipe 20b to a processor cold plate 22 and then back through return pipe 20a. A processor 24 of a processor-based system may be in thermal contact with the cold plate 22.

Referring to FIG. 2, a processor-based system 40 may include the processor 24 thermally coupled to the cooling system 10. The processor 24 may be electrically coupled to an interface 42, such as a bridge. The interface 42 is coupled to a memory 44 and a bus 46. The bus 46 may, in turn, be coupled to another interface 48, such as a bridge. The interface 48 may also be coupled to a hard disk drive 50 in one embodiment.

In some embodiments, the interface 48 may provide electrical signals to the cooling system 10 to control its operation. For example, based on the performance or temperature of the processor 24, additional cooling may be provided under control of the interface 48. Thus, signals may be provided to the connectors 18 and 16 to control the fan 14 and pump 30 to achieve a desired processor 24 temperature.

Other details of the construction and operation of the liquid cooling system 10 may be had with reference to the '012 patent. Various attachment techniques described in the '012 patent include welding to the housing or clips.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

FIG. 4 is another perspective view of the electronic system from FIG. 3, with the liquid cooling unit in an open position, in accordance with some embodiments of the invention;

FIG. 5 is an enlarged, fragmented, perspective view of the area 5 in FIG. 4;

FIG. 6 is another perspective view of the electronic system from FIG. 3, with the liquid cooling unit in a closed position, in accordance with some embodiments of the invention;

FIG. 7 is an enlarged, fragmented, perspective view of the area 7 in FIG. 6;

DESCRIPTION

Figure 1:
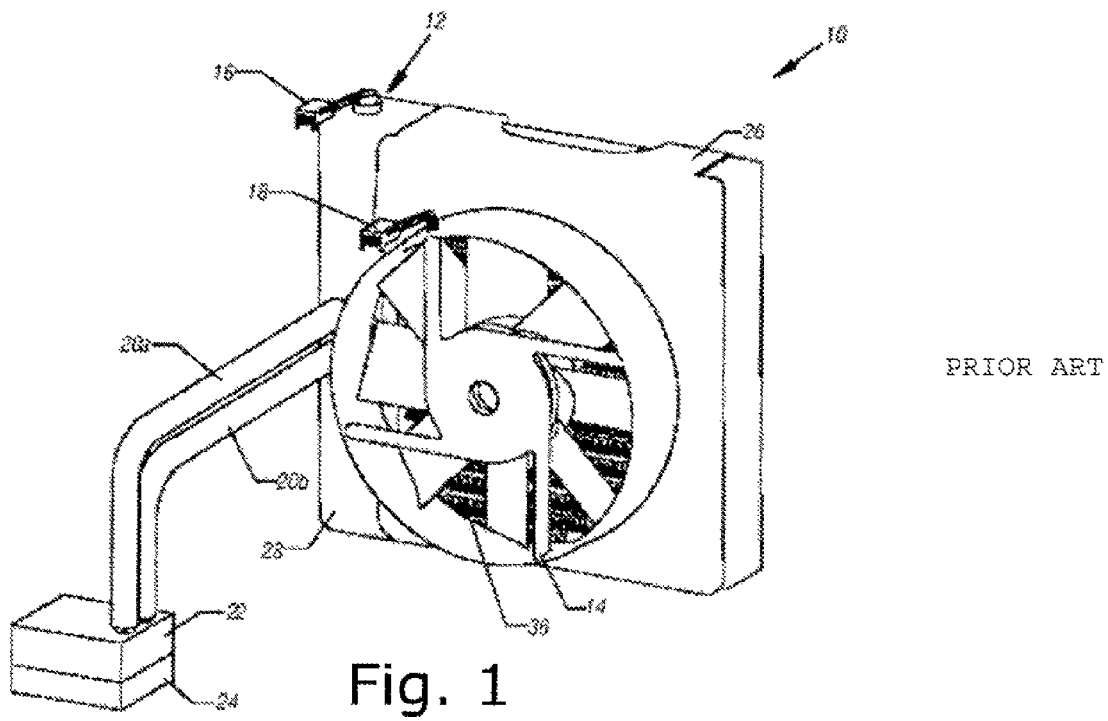
FIG. 1 is a perspective view of a liquid cooling system.
Figure 2:
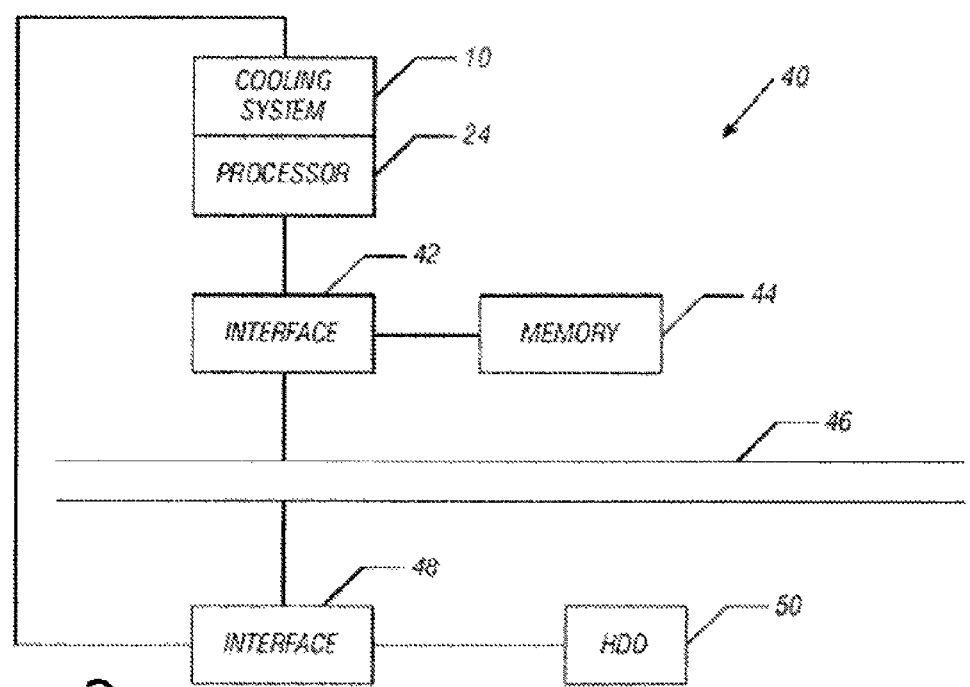
FIG. 2 is a schematic depiction of a liquid cooling system for a processor-based device.
Figure 3:
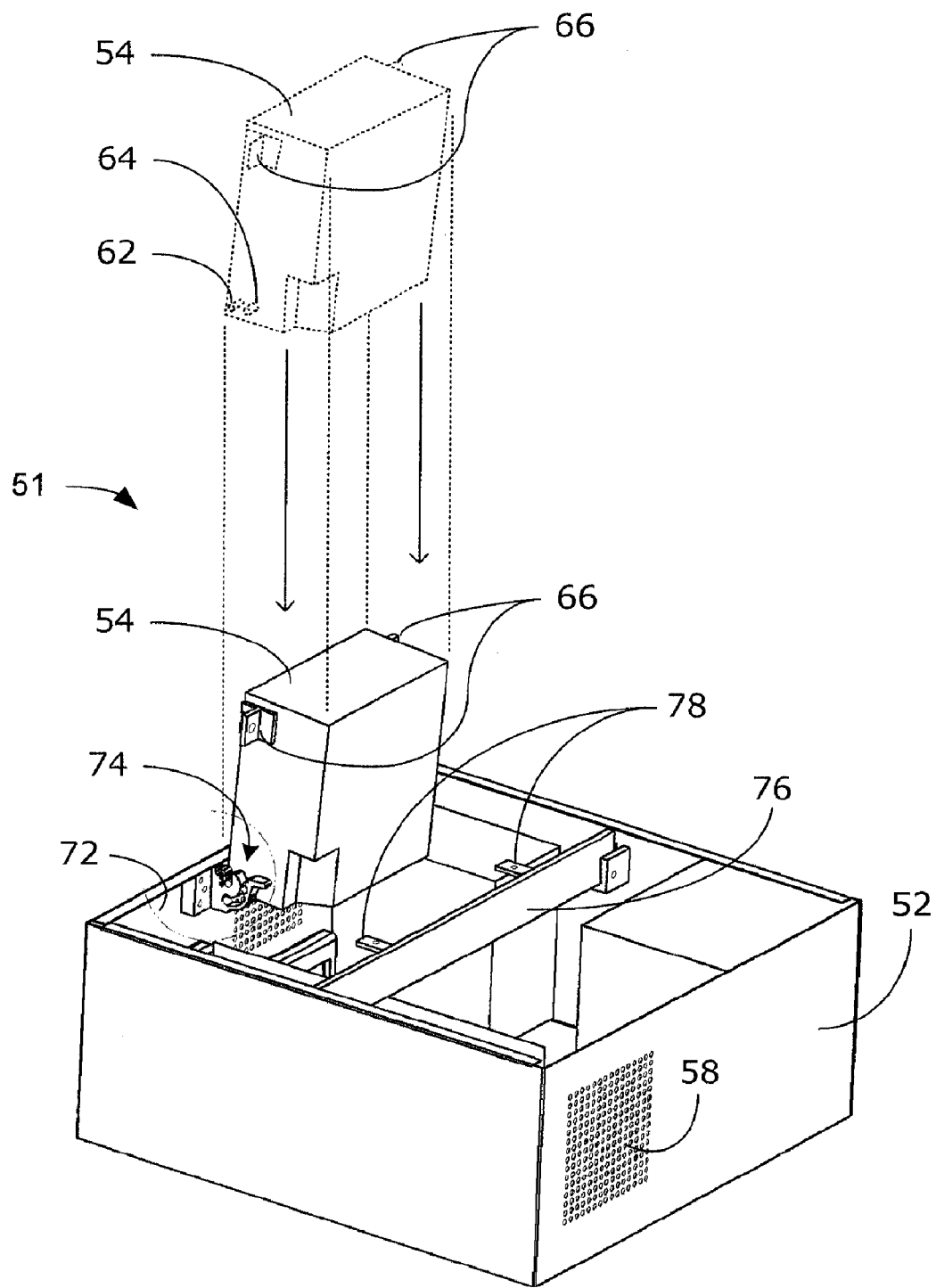
FIG. 3 is a perspective view of an electronic system including a liquid cooling unit, in accordance with some embodiments of the invention.

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

As noted above, an electronic system utilizing liquid cooling may include a heat exchanger with circulating fluid, a fan to circulate air through the heat exchanger, and a cold plate that attaches to an electronic component to be cooled and is connected to the heat exchanger, for example, by fluid carrying tubes. Liquid cooling system may effectively cool high performance processor-based systems, but presents certain challenges in the assembly of the system. For example, the combined heat exchanger/fan/shroud assembly (possibly also including a pump and/or reservoir, also referred to herein as HEXFS) may be relatively heavy and difficult or awkward to handle during assembly of the electronic system. The weight of the HEXFS assembly may be such that the HEXFS could damage other components of the electronic system if dropped or mishandled during the assembly of the electronic system. Conventional attachment techniques may increase the risk of such damage because the HEXFS is generally held in close proximity to such electronic component when the cold plate is connected to the HEXFS. The HEXFS may also be relatively bulky (e.g. taking up a fair amount of space inside the chassis of the electronic system).

According to some embodiments, a cooling device may be mounted to a portion of a chassis of an electronic system, wherein the cooling device may be releasably and pivotably attached to the chassis in at least an open position to permit access to components within the electronic system and a closed position to permit installation of a cover on the chassis.

For example, according to some embodiments of the invention, a housing for a heat exchanger may include positioning pins disposed on the housing for positioning the housing on a chassis during assembly and a lock member disposed on the housing and positioned to cooperate with a corresponding structure on the chassis to temporarily secure the housing in an open position. The housing may further include a stop member disposed on the housing and positioned to cooperate with a corresponding feature on the chassis to inhibit movement of the housing beyond a closed position. For example, the housing may form a shroud and further include a fan configured to direct air through the shroud and over the cooling unit to provide a heat exchanger assembly (e.g. a HEXFS).

For example, in some embodiments, a heat exchanger assembly may be mechanically attached to a chassis of an electrical system utilizing mounting blocks or other features such as keyed mounting structures provided on a chassis panel (e.g. a back input/output (I/O) panel), with such blocks or other features on the chassis interfacing with pins or stops on the shroud (e.g. that encloses the fan and heat exchanger) to enable the heat exchanger assembly to be positioned up out of the way and provide access inside the chassis under the installed location in the chassis for the heat exchanger assembly. Having the heat exchanger assembly positioned on the chassis, but out of the way, may be particularly useful during cold plate integration onto the main board.

Preferably, the heat exchanger assembly includes features which promote keeping the heat exchanger assembly temporarily secured in an open position (such as bumps or pins on the shroud that have a slight interference fit with the mounting blocks as they rotate past the blocks or a square post that interfaces with a keyed block on the chassis back I/O face) to inhibit the heat exchanger assembly from falling down onto the installer's hands or onto main board components. After the cold plate has been integrated onto the main board the heat exchanger assembly may be rotated (or in some other manner repositioned—depending on the particular design implementation) into the closed position. Preferably, the heat exchanger assembly includes further features which cooperate with corresponding chassis features to inhibit the heat exchanger assembly from contacting system components (such as add-in cards and disk drives).

With reference to FIGS. 3-8, an electronic system 51 includes a chassis 52 and a cooling device 54 which may be mounted to a portion of the chassis 52. The cooling device 54 may be releasably and pivotably attached to the chassis 52 in at least an open position (e.g. see FIGS. 3 and 4), to permit access to components within the chassis 52, and a closed position (e.g. see FIGS. 6 and 8), to permit installation of a cover 56 on the chassis 52.

The cooling unit 54 is shown in general form, but may be a HEXFS assembly of a liquid cooling system. The cooling unit 54 includes a pair of positioning pins 62, at least one lock member 64 (and preferably a pair of lock pins 64), and at least one stop member 66 (and preferably a pair of stop tabs 66) disposed on the cooling unit 54. In some examples, the positioning pins 62 may be aligned along a line A (see FIG. 6), defining an axis of rotation for pivoting the cooling unit 54 from the open position to the closed position, such that the positioning pins 62 may also be considered hinge pins 62.

The chassis 52 includes a panel 72 having a pair of mounting blocks 74 secured to the panel 72. The mounting blocks 74 are positioned and configured to receive the hinge pins 62. The lock pins 64 cooperate with structures on the mounting blocks 74 to temporarily secure the cooling unit 54 in an open position, as illustrated in FIGS. 4-5. In the open position, access is provided inside the chassis for assembly operations. For example, in the case of a HEXFS, a cold plate may be coupled to an electronic component and tubing may be connected between the cold plate and the HEXFS.

The chassis 52 may further include features which cooperate with the stop tabs 66 to inhibit the cooling unit from moving beyond a desired closed position. For example, the chassis 52 includes a beam 76 having at least one corresponding blocking member 78 (e.g. a protruding tab) which is positioned to block the stop tab 66 from moving beyond the closed position when the cooling unit 54 is re-positioned from the open to the closed position. The beam 76 may be a cross beam 76 which extends between opposed panels of the chassis 52, or a beam that cantilevers from a side of the chassis power supply or other structure of the chassis 52. The cooling unit 54 may be secured in the closed position, for example, by fasteners 82 which fasten the stop tabs 66 against the blocking tabs 78 (see FIG. 8).

Figure 8:
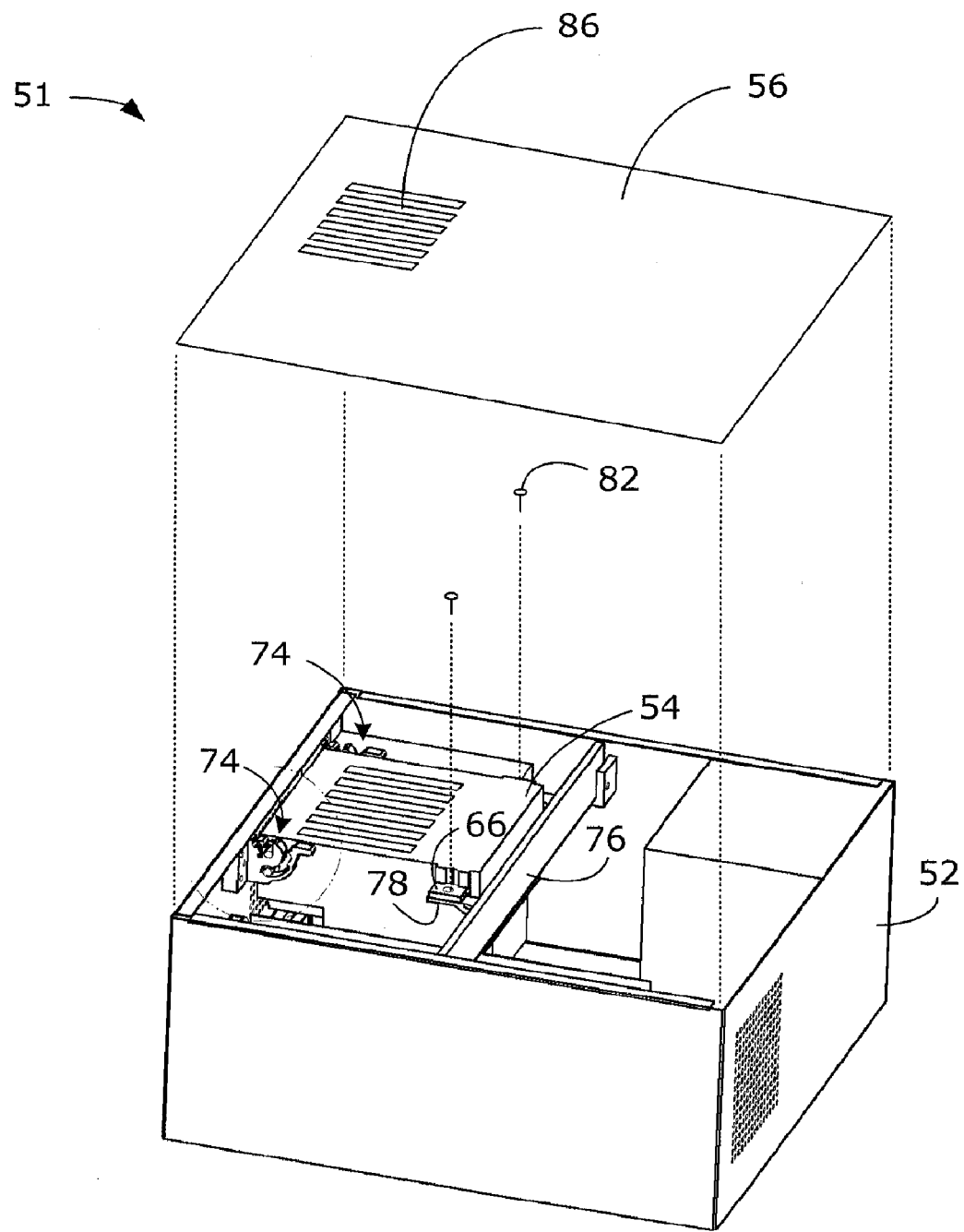
FIG. 8 is another perspective view of the electronic system from FIG. 3, including a cover panel.

With the cooling unit 54 in the closed position, the cover 56 may be attached to the chassis 52 (e.g. see FIG. 8). The cover 56 may include one or more air flow openings 86. In some examples, a gasket may be provided between the cover 56 and the cooling unit 54 to promote more air being drawn into the chassis 52 through the opening 86. The chassis 52 may also include one or more air flow openings 58 (e.g. perforated portions of chassis panels). As may be necessary or desirable, the openings 58 and 86 may be configured to inhibit radio frequency interference.

The assembly of the electronic system 51 may include positioning the cooling unit 54 on the chassis 52 (e.g. see FIG. 3), temporarily securing the cooling unit 54 on the chassis 52 in an open position providing access inside the chassis 52 (e.g. see FIGS. 3-5), moving the cooling unit 54 from the open position to a closed position without removing the cooling unit 54 from the chassis 52 (e.g. see FIGS. 4 and 6-7), and securing the cooling unit 54 in the closed position (e.g. see FIG. 8).

For example, positioning the cooling unit 54 on the chassis 52 may include inserting the hinge pins 62 into corresponding mounting blocks 74 on the chassis 52. For example, moving the cooling unit 54 from the open position to the closed position may include rotating the cooling unit 54 on the hinge pins 62. For example, temporarily securing the cooling unit 54 on the chassis 52 in the open position may include providing a lock member 64 on the cooling unit 54 which cooperates with a corresponding structure on the chassis 52 to temporarily secure the cooling unit 54 in the open position. For example, the lock member 64 comprises a protuberance on a housing of the cooling unit 54.

The assembly of the electronic system 51 may further include inhibiting the cooling unit 54 from moving inside the chassis 52 beyond the closed position by, for example, providing a stop member 66 on the cooling unit 54 which cooperates with a corresponding structure on the chassis 52 to inhibit the movement of the cooling unit 54 beyond the closed position. For example, the stop member 66 may include a protuberance on a housing of the cooling unit 54. For example, the corresponding structure on the chassis 52 may include the cross beam 76 which extends between opposed panels of the chassis 52 with at least one blocking member 78 on the beam 76 positioned to contact the stop member 66 when the cooling unit 54 is re-positioned from the open to the closed position. In other embodiments, the beam 76 may be a cantilever beam or the beam 76 may be omitted and the stop member may cooperate with a blocking member provided directly on panels of the chassis to inhibit over-rotation of the cooling unit 54.

Advantageously, some embodiments of the invention allow a system integrator (e.g. an assembler of a computer system) access to the main board core area to install a "cold plate" and its associated attach clip(s) to the electronic component (e.g. processor) with the HEXFS held up out of the way (e.g. at approximately 90 degrees to the main board) while at the same time providing mechanical robustness necessary to survive mechanical shock and vibration events (e.g. when completely installed—i.e., "rotated" down into the final integrated position).

With reference to FIGS. 9-13, an electronic system 90 includes a chassis 92 and a cooling device 94 which may be mounted to a portion of the chassis 92. The cooling device 94 may be releasably and pivotably attached to the chassis 92 in at least an open position (e.g. see FIGS. 9 and 10), to permit access to components within the electronic system 90, and a closed position (e.g. see FIG. 11), to permit installation of a cover 96 on the chassis 92 (see FIG. 12).

Figure 11:
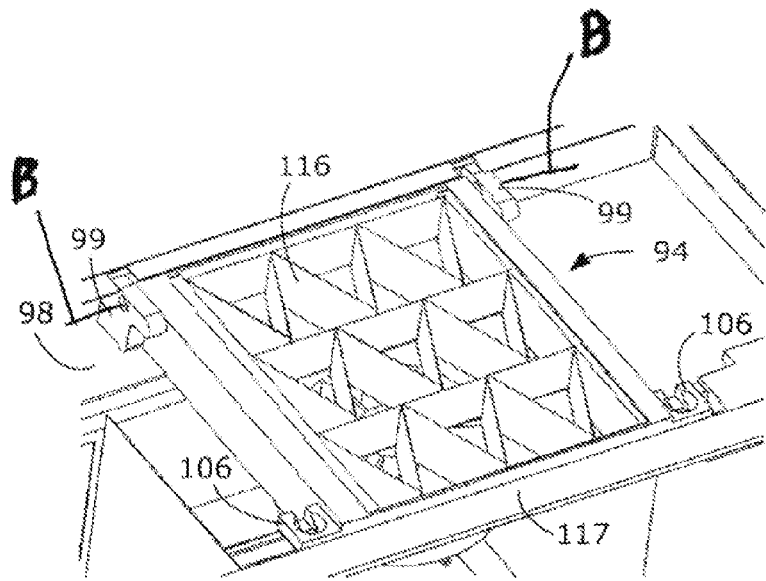
FIG. 11 is another enlarged, fragmented, perspective view of the electronic system from FIG. 9, with the liquid cooling unit in a closed position, in accordance with some embodiments of the invention.
Figure 12:
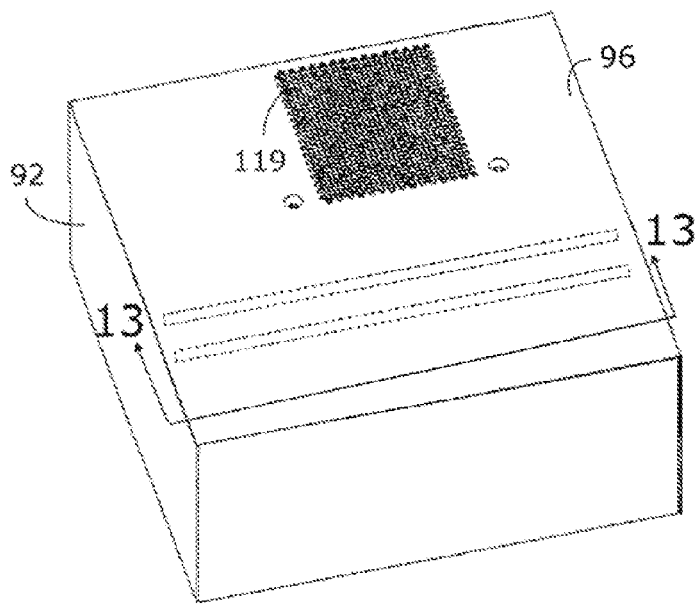
FIG. 12 is a perspective view of the electronic system from FIG. 9, including a cover panel.

The cooling unit 94 may be a HEXFS assembly of a liquid cooling system, including a fan 112, a housing shroud 114, and a heat exchanger 116 (see FIG. 11). The cooling unit 94 includes a pair of positioning pins 102, at least one lock member 104 (and preferably a pair of lock bumps 104), and at least one stop member 106 (and preferably a pair of stop tabs 106). In some examples, the positioning pins 102 may be aligned along a line B (see FIG. 11), defining an axis of rotation for pivoting the cooling unit 94 from the open position to the closed position, such that the positioning pins 102 may also be considered hinge pins 102.

Figure 9:
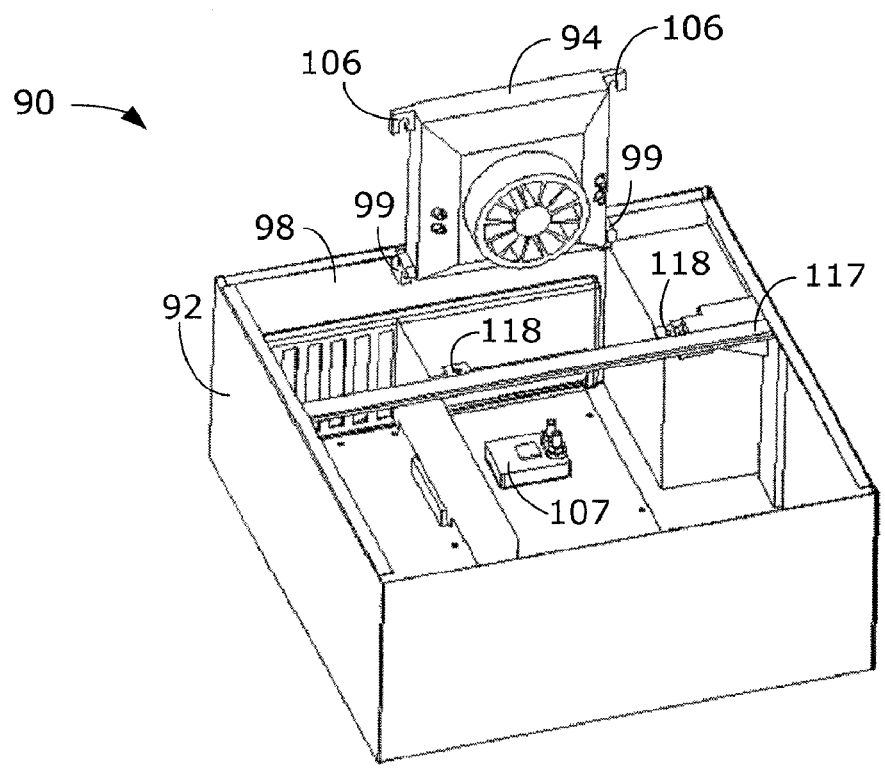
FIG. 9 is a perspective view of another electronic system, with a liquid cooling unit in an open position, in accordance with some embodiments of the invention.
Figure 10:
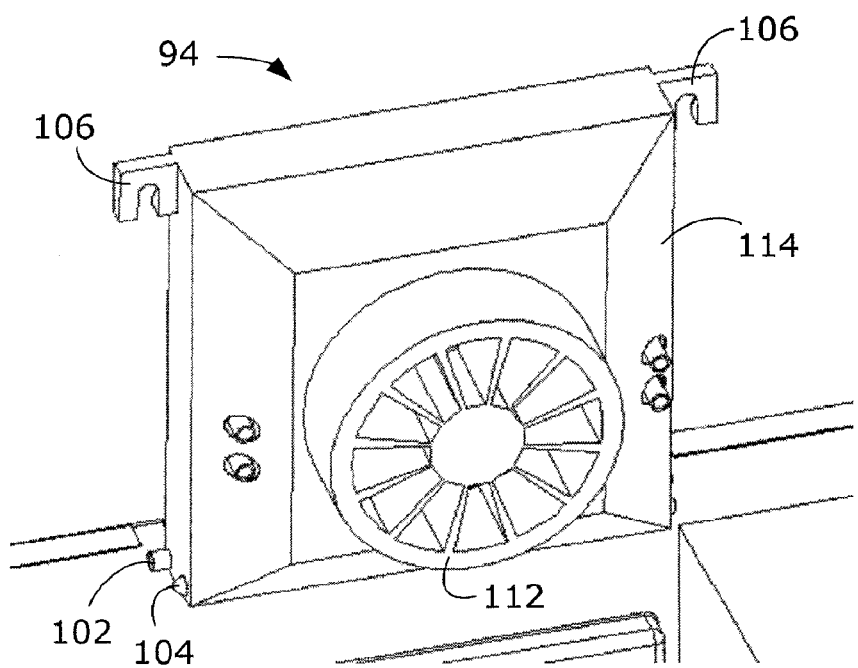
FIG. 10 is an enlarged, fragmented, perspective view of the liquid cooling unit from FIG. 9.

The chassis 92 includes a panel 98 having a pair of mounting blocks 99 secured to the panel 98. The mounting blocks 99 are positioned and configured to receive the hinge pins 102. The lock bumps 104 cooperate with structures on the mounting blocks 99 to temporarily secure the cooling unit 94 in an open position, as illustrated in FIGS. 9-10. In the open position, access is provided inside the chassis for assembly operations. For example, in the case of a HEXFS, a cold plate 107 may be coupled to an electronic component (e.g. with attach clips) and tubing may be connected between the cold plate and the HEXFS (see FIG. 9).

For example, the lock bumps 104 may hold the HEXFS in the open position via an interference fit with corresponding detent features in the mounting blocks 99. After the cold plate 107 has been integrated, the lock bumps 104 may be rotated out of the detents (e.g. with a suitable amount of force from the assembler) to rotate the HEXFS into the closed position.

The chassis 92 may further include features which cooperate with the stop tabs 106 to inhibit the cooling unit from moving beyond a desired closed position. For example, the chassis 92 includes a beam 117 having at least one corresponding blocking member 118 (e.g. a protruding tab) which is positioned to block the stop tab 106 from moving beyond the closed position when the cooling unit 94 is re-positioned from the open to the closed position. The beam 117 may be a cross beam 117 which extends between opposed panels of the chassis 92. The cooling unit 94 may be secured in the closed position, for example, by fasteners (not shown) which fasten the stop tabs 106 against the blocking tabs 118. In other embodiments, the beam 117 may be a cantilever beam or the beam 117 may be omitted and the stop tabs may cooperate with blocking members provided directly on panels of the chassis to inhibit over-rotation of the cooling unit 94.

With the cooling unit 94 in the closed position, the cover 96 may be attached to the chassis 92. The cover 96 may include one or more air flow openings 119. In some examples, a gasket may be provided between the cover 96 and the cooling unit 94 to promote more air being drawn into the chassis 92 through the opening 119. The chassis 92 may also include one or more air flow openings (e.g. perforated portions of chassis panels). As may be necessary or desirable, the air flow openings may be configured to inhibit radio frequency interference.

Advantageously, the cooling unit 94 is located in close proximity to the electrical component (e.g. a processor) which is cooled by the cold plate 107. From this location, outside cooling air (e.g. external to the chassis 92) may be drawn inside the chassis and blown over the core area of the main board (i.e., central processing unit, chipset, and voltage regulation circuits) to provide cooling while at the same time taking advantage of the typically unused area above the main board (e.g. as typically seen in ATX and micro-ATX standard compliant systems). Utilization of this typically unused space reduces the likelihood that the cooling unit 92 might interfere with typical system components such as hard disk & floppy disk drives, long add-in (graphics) cards, and CD-ROM drives. In some applications, this mounting scheme may not require any additional rear system cooling fan because of the close proximity of the cooling unit fan to the main board core area. In some applications, this mounting method may also reduce the likelihood that the cooling unit 94 might contact other system components (such as add-in cards and disk drives) that could occur during a mechanical shock or vibration event.

Figure 13:
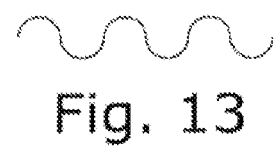
FIG. 13 is a representative cross sectional view of the cover panel, taken along line 13-13 in FIG. 12.

With reference to FIG. 13, a representative cross section of the cover panel 96 shows how stiffening undulations or corrugations can be used to stiffen the chassis cover panel 96.

With reference to FIGS. 14-18, an electronic system 140 includes a chassis 142 and a cooling device 144 which may be mounted to a portion of the chassis 142. The cooling device 144 may be releasably and pivotably attached to the chassis 142 in at least an open position (e.g. see FIG. 14), to permit access to components within the electronic system 140, and a closed position (not shown), to permit installation of a cover on the chassis 142.

The cooling unit 144 is shown in general form, but may be a HEXFS assembly of a liquid cooling system, including a fan, a housing shroud, and a heat exchanger. The cooling unit 144 includes a pair of positioning pins 152, at least one lock member 154 (and preferably a pair of lock bumps 154), and at least one stop member 156 (and preferably a pair of ears or stop tabs 156). In some examples, the positioning pins 152 may be aligned along a line, defining an axis of rotation for pivoting the cooling unit 144 from the open position to the closed position, such that the positioning pins 152 may also be considered hinge pins 152.

Figure 14:
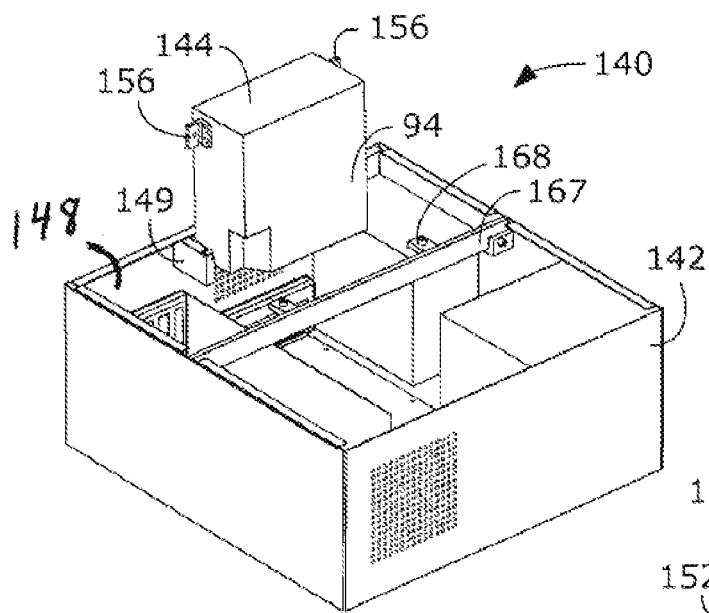
FIG. 14 is a perspective view of another electronic system including a liquid cooling unit in an open position, in accordance with some embodiments of the invention.
Figure 15:
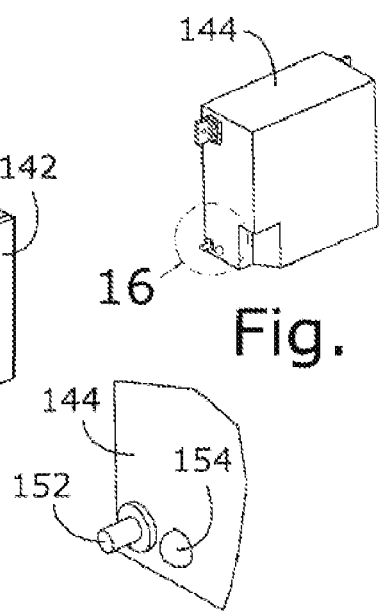
FIG. 15 is a perspective view of the liquid cooling unit from FIG. 14.
Figure 16:
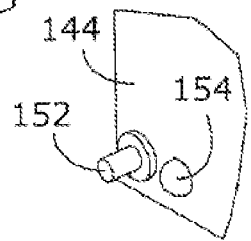
FIG. 16 is an enlarged, fragmented, perspective view of the area 16 in FIG. 15.
Figure 17:
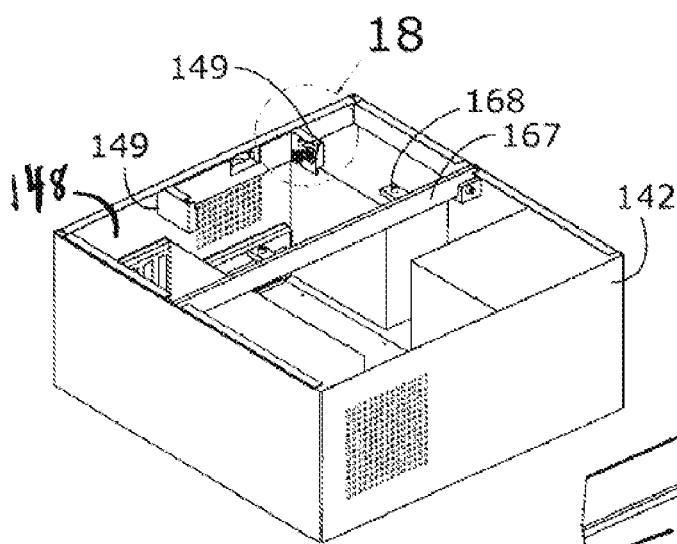
FIG. 17 is another perspective view of the electronic system from FIG. 14, without the liquid cooling unit to show hinge detail, in accordance with some embodiments of the invention.

The chassis 142 includes a panel 148 having a pair of mounting blocks 149 secured to the panel 148. The mounting blocks 149 are positioned and configured to receive the hinge pins 152. The lock bumps 154 cooperate with structures on the mounting blocks 149 to temporarily secure the cooling unit 144 in an open position, as illustrated in FIG. 14. In the open position, access is provided inside the chassis for assembly operations. For example, in the case of a HEXFS, a cold plate may be coupled to an electronic component and tubing may be connected between the cold plate and the HEXFS.

Figure 18:
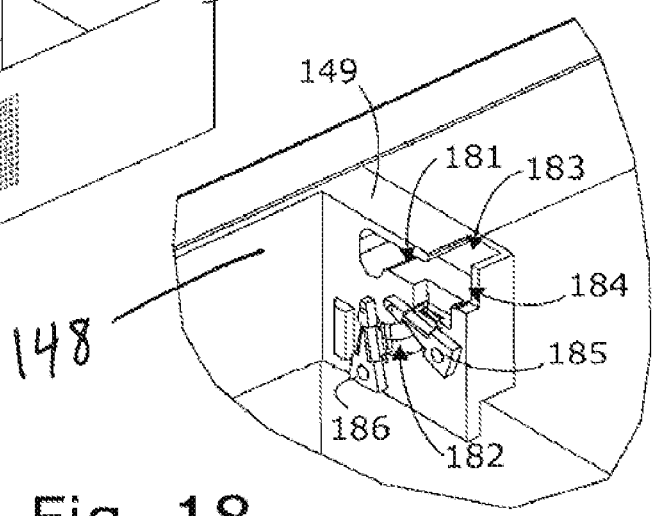
FIG. 18 is an enlarged, fragmented, perspective view of the area 18 in FIG. 17.

With reference to FIG. 18, the mounting block 149 may include a first channel 181 adapted to receive the hinge pin 152 and a second channel 182 adapted to receive the lock bump 154. The mounting block 149 may include a first opening 183 sized appropriately to receive the hinge pin 152 into the mounting block 149. Once the hinge pin 152 is seated in the first channel 181, the pin 152 may be slid into the mounting block 149 towards the panel 148. The mounting block 149 defines a second opening 184 appropriately sized to receive the lock bump 154. With the pin 152 slid sufficiently into the mounting block 149, the lock bump 154 may be received in the second channel 182. The mounting block 149 may include one or more resilient lock members 185, 186 at desired positions along the second channel 182. The resilient lock members 185, 186 are adapted to engage the lock bump 154. For example, the resilient lock members 185 and 186 may be made of plastic.

For example, the lock bump 154 may hold the HEXFS in the open position via an interference fit with the resilient lock member 185. After the cold plate has been integrated, the lock bump 154 may be rotated out of the resilient lock member 185 (e.g. with a suitable amount of force from the assembler) to rotate the HEXFS into the closed position. For example, in the closed position the lock bump 154 may be engaged with the second resilient lock member 186. Additional resilient lock members may be provided along the second channel 182 at intermediate positions between the open and closed positions, as may be desirable for particular assembly applications. Preferably, the mounting blocks 149 are mirror images of each other, each provided with corresponding resilient lock members 185, 186 to temporarily secure the cooling unit 144 in the open and closed positions, respectively.

The chassis 142 may further include features which cooperate with the stop tabs 156 to inhibit the cooling unit from moving beyond a desired closed position. For example, the chassis 142 includes a beam 167 having at least one corresponding blocking member 168 (e.g. a protruding tab) which is positioned to block the stop tab 156 from moving beyond the closed position when the cooling unit 144 is re-positioned from the open to the closed position. The beam 167 may be a cross beam 167 which extends between opposed panels of the chassis 142. The cooling unit 144 may be secured in the closed position, for example, by fasteners (not shown) which fasten the stop tabs 156 against the blocking tab 158. In other embodiments, the beam 167 may be a cantilever beam or the beam 167 may be omitted and the stop tabs may cooperate with a blocking member provided directly on panels of the chassis to inhibit over-rotation of the cooling unit 144.

With the cooling unit 144 in the closed position, the cover may be attached to the chassis 142. The cover may include one or more air flow openings. The chassis 142 may also include one or more air flow openings (e.g. perforated portions of chassis panels). As may be necessary or desirable, the air flow openings may be configured to inhibit radio frequency interference.

With reference to FIGS. 19-26, an electronic system 190 includes a chassis 192 and a cooling device 194 which may be mounted to a portion of the chassis 192. The cooling device 194 may be releasably and pivotably attached to the chassis 192 in at least an open position (e.g. see FIGS. 19 and 23), to permit access to components within the electronic system 190, and a closed position (see FIGS. 25 and 26), to permit installation of a cover 196 on the chassis 192.

The cooling unit 194 is shown in general form, but may be a HEXFS assembly of a liquid cooling system, including a fan, a housing shroud, and a heat exchanger. The cooling unit 194 includes a pair of positioning pins 202, at least one lock member 204 (and preferably a pair of lock pins 204), and at least one stop member 206 (and preferably a pair of stop tabs 206). In some examples, the positioning pins 202 may be aligned along a line C (see FIG. 22), defining an axis of rotation for pivoting the cooling unit 194 from the open position to the closed position, such that the positioning pins 202 may also be considered hinge pins 202.

Figure 19:
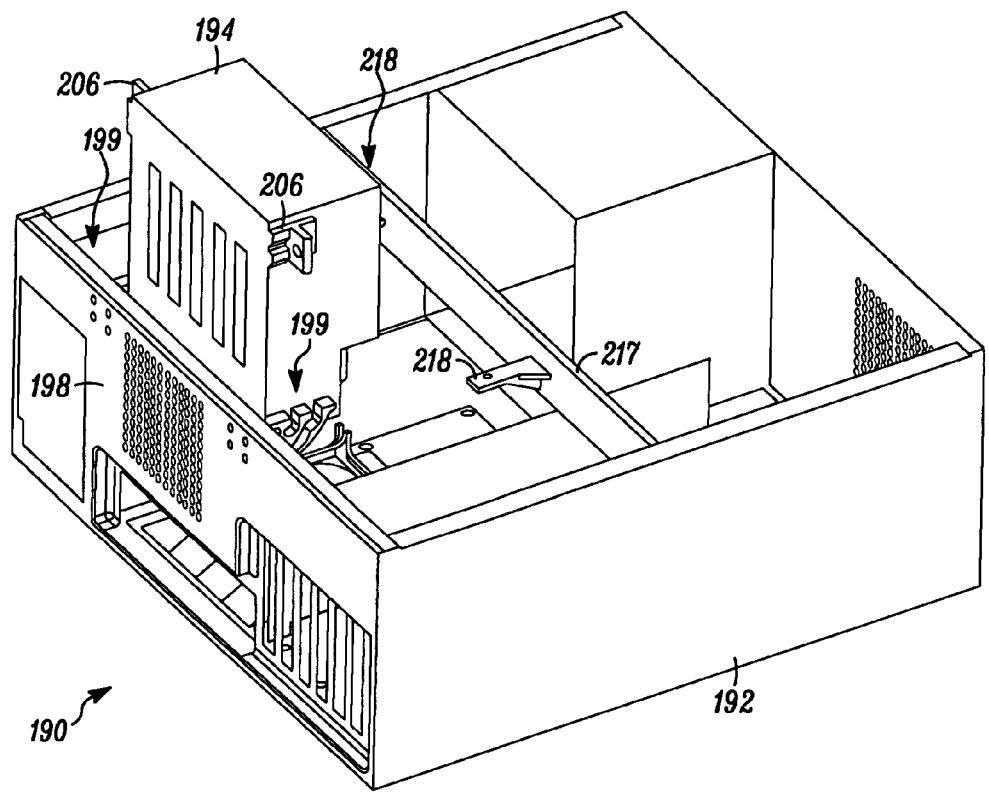
FIG. 19 is a perspective view of another electronic system, with a liquid cooling unit in an open position, in accordance with some embodiments of the invention.
Figure 20:
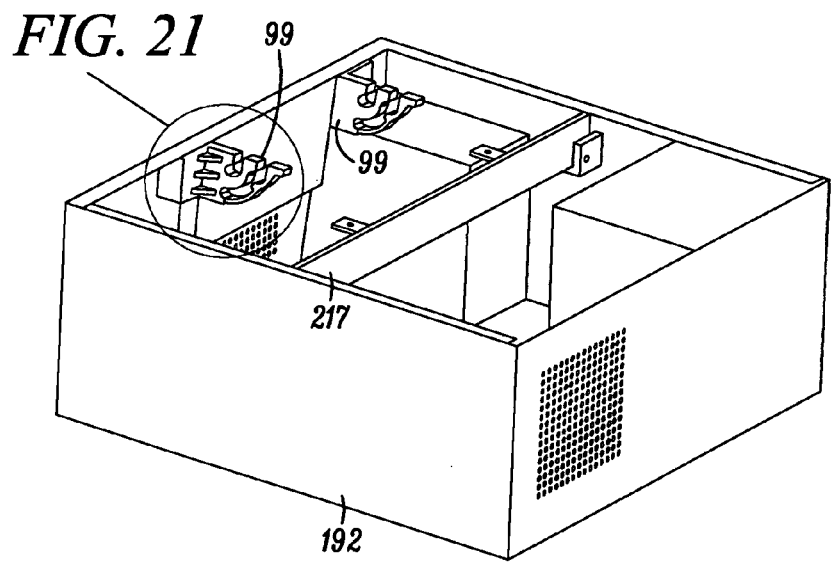
FIG. 20 is a perspective view of another electronic system, without the liquid cooling unit to show hinge detail, in accordance with some embodiments of the invention.
Figure 21:
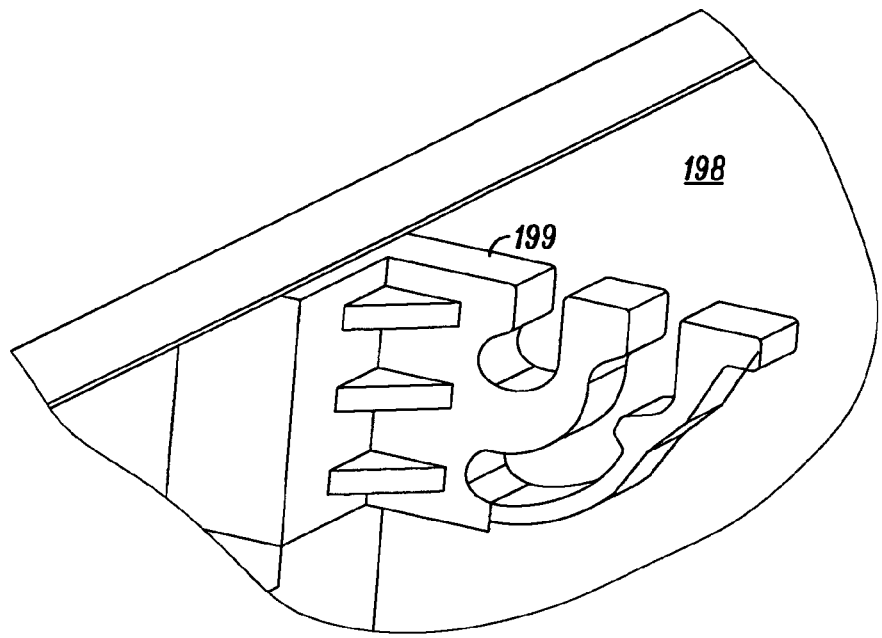
FIG. 21 is an enlarged, fragmented, perspective view of the area 21 in FIG. 20.
Figure 22:
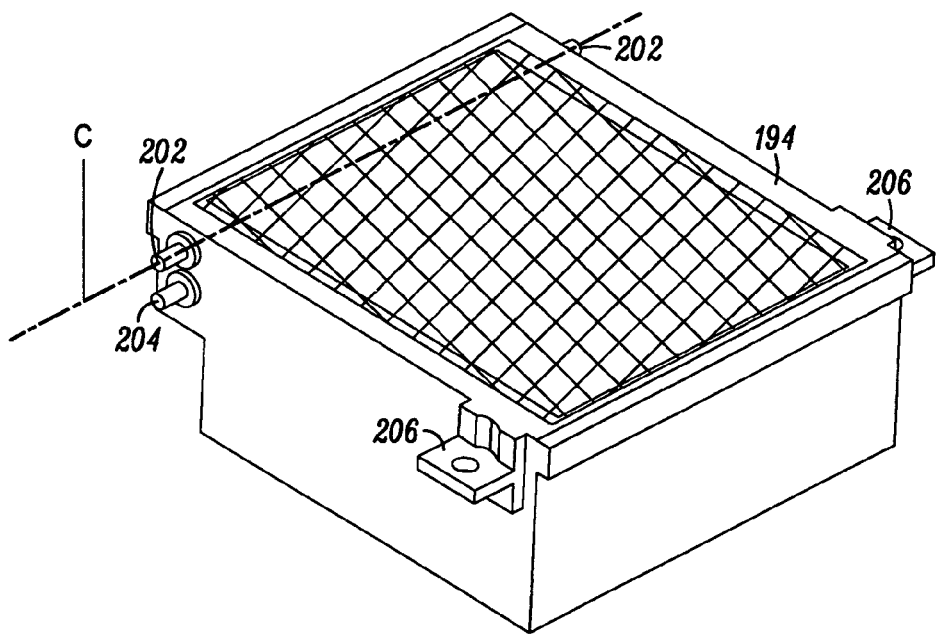
FIG. 22 is a perspective view of the liquid cooling unit from FIG. 19.
Figure 23:
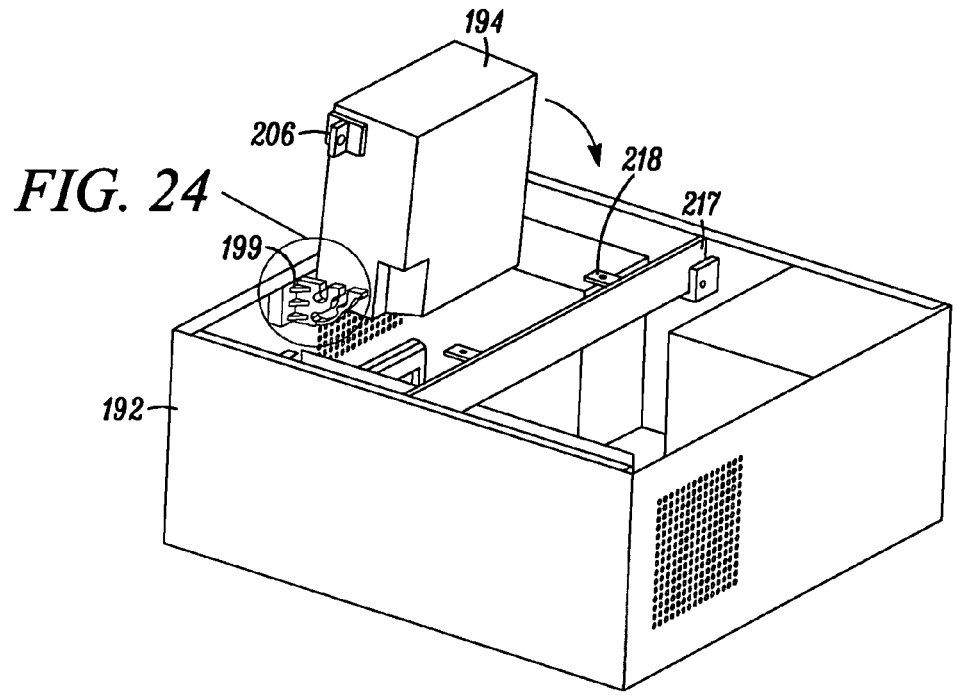
FIG. 23 is another perspective view of the electronic system in FIG. 19, with the liquid cooling unit in the open position, in accordance with some embodiments of the invention.
Figure 24:
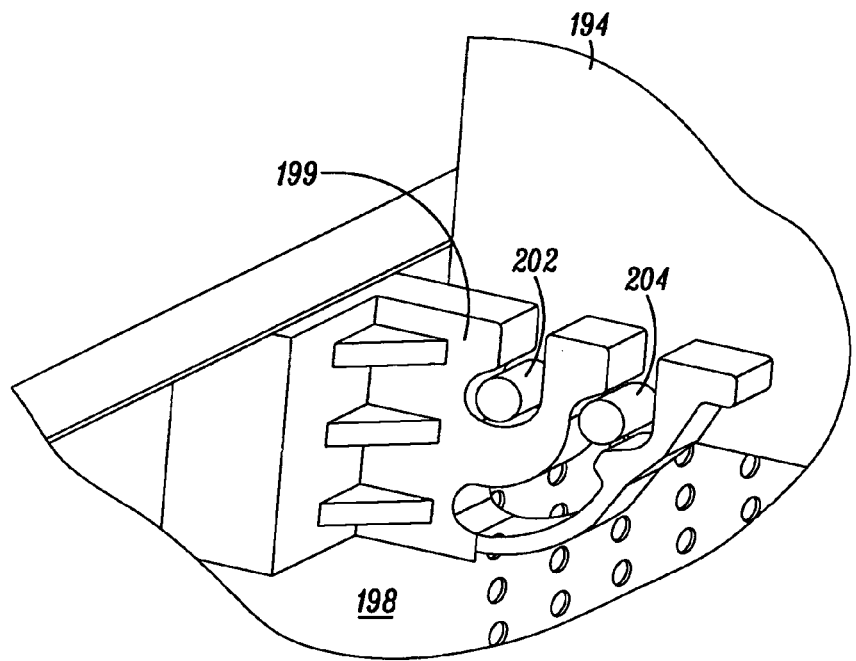
FIG. 24 is an enlarged, fragmented, perspective view of the area 24 in FIG. 23.
Figure 25:
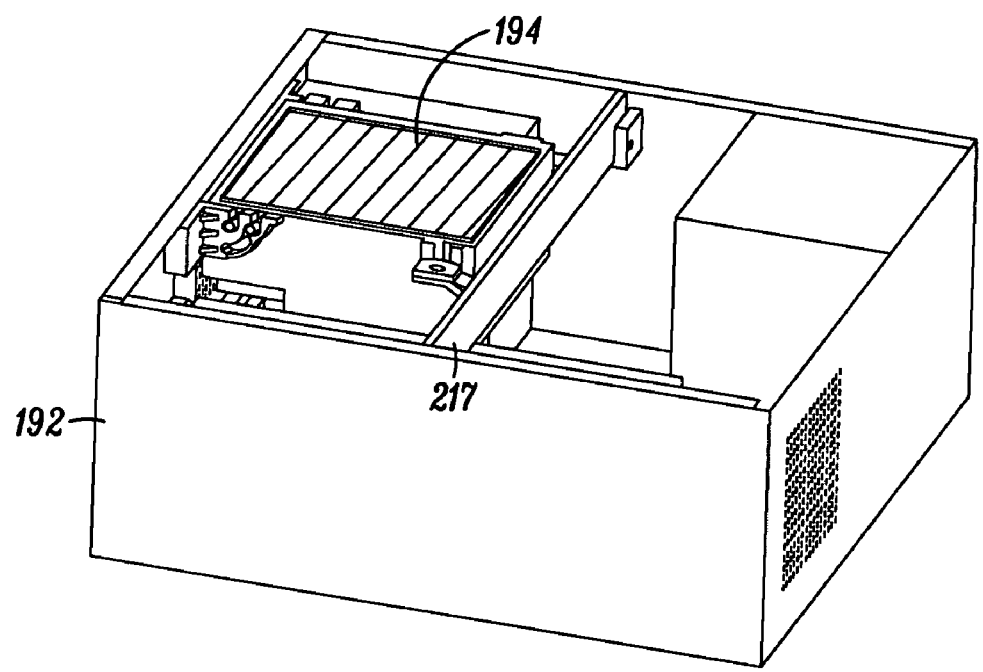
FIG. 25 is another enlarged, fragmented, perspective view of the electronic system from FIG. 19, with the liquid cooling unit in a closed position, in accordance with some embodiments of the invention.
Figure 26:
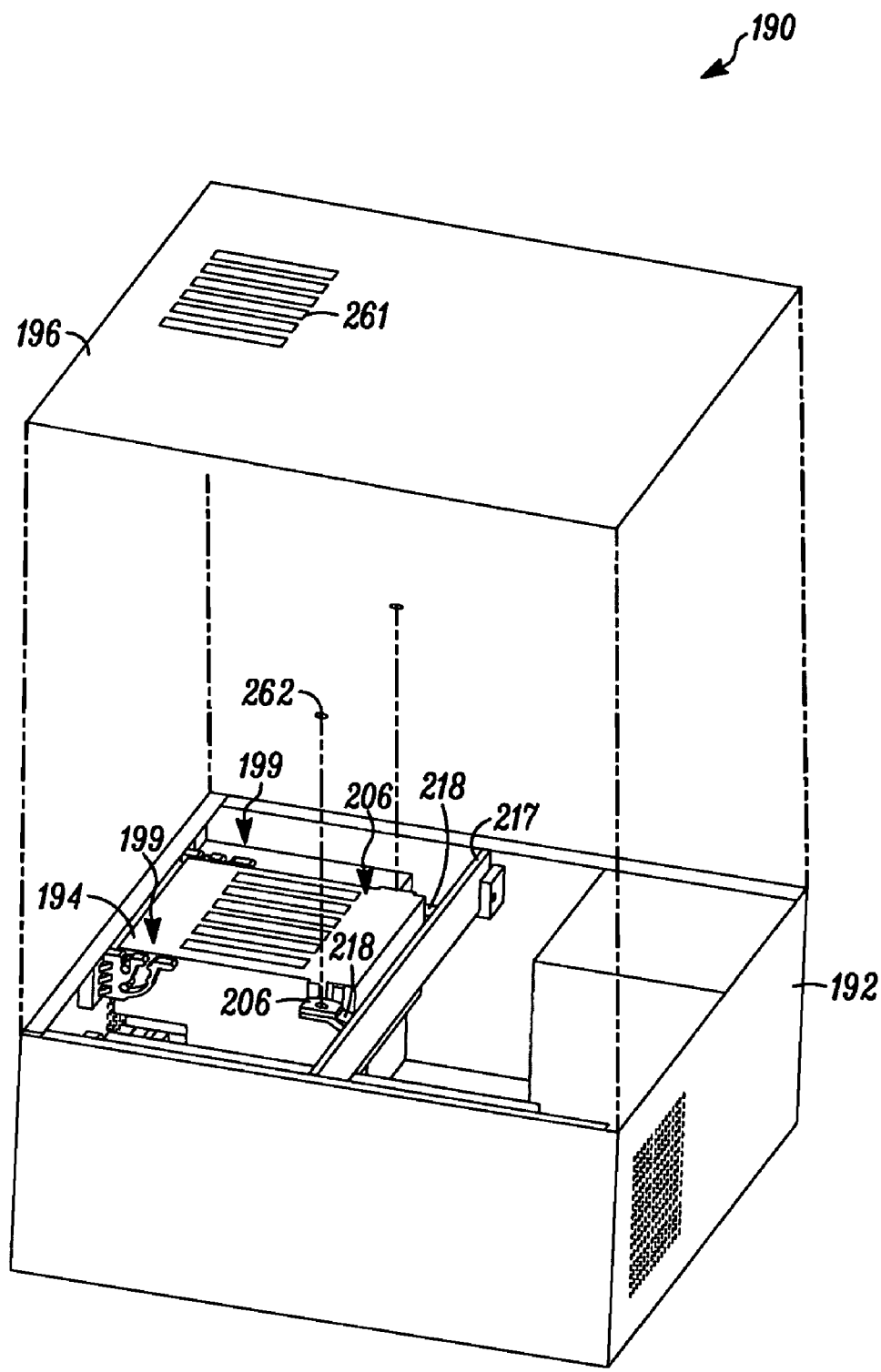
FIG. 26 is another perspective view of the electronic system from FIG. 19, including a cover panel.

The chassis 192 includes a panel 198 having a pair of mounting blocks 199 secured to the panel 198. The mounting blocks 199 are positioned and configured to receive the hinge pins 192. The lock pins 204 cooperate with structures on the mounting blocks 199 to temporarily secure the cooling unit 194 in an open position, as illustrated in FIG. 19. In the open position, access is provided inside the chassis 192 for assembly operations. For example, in the case of a HEXFS, a cold plate may be coupled to an electronic component and tubing may be connected between the cold plate and the HEXFS.

Preferably, the mounting blocks 199 are electrically isolating. Further details regarding the construction and operation of the mounting blocks 199 may be had with reference to the parent '732 application.

The chassis 192 may further include features which cooperate with the stop tabs 206 to inhibit the cooling unit from moving beyond a desired closed position. For example, the chassis 202 includes a beam 217 having at least one corresponding blocking member 218 (e.g. a protruding tab) which is positioned to block the stop tab 206 from moving beyond the closed position when the cooling unit 194 is re-positioned from the open to the closed position. The beam 217 may be a cross beam 217 which extends between opposed panels of the chassis 192. The cooling unit 194 may be secured in the closed position, for example, by fasteners 262 (see FIG. 26) which fasten the stop tabs 206 against the blocking tabs 218. In other embodiments, the beam 217 may be a cantilever beam or the beam 217 may be omitted and the stop tabs may cooperate with a blocking member provided directly on panels of the chassis to inhibit over-rotation of the cooling unit 194.

With the cooling unit 194 in the closed position, the cover 196 may be attached to the chassis 192. In some applications, the fasteners which secure the stop tabs 206 against the blocking members 218 may go through the outside of the cover 196. The cover 196 may include one or more air flow openings 261. In some examples, a gasket may be provided between the cover 196 and the cooling unit 194 to promote more air being drawn into the chassis 192. The chassis 192 may also include one or more air flow openings (e.g. perforated portions of chassis panels). As may be necessary or desirable, the air flow openings may be configured to inhibit radio frequency interference.

Figure 27:
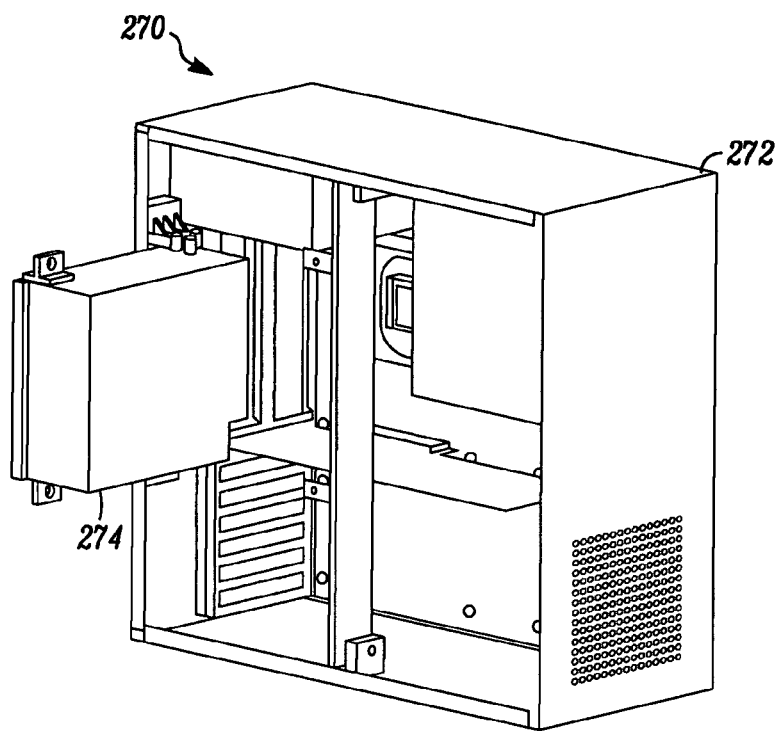
FIG. 27 is a perspective view of another electronic system, with a liquid cooling unit in an open position, in accordance with some embodiments of the invention.
Figure 28:
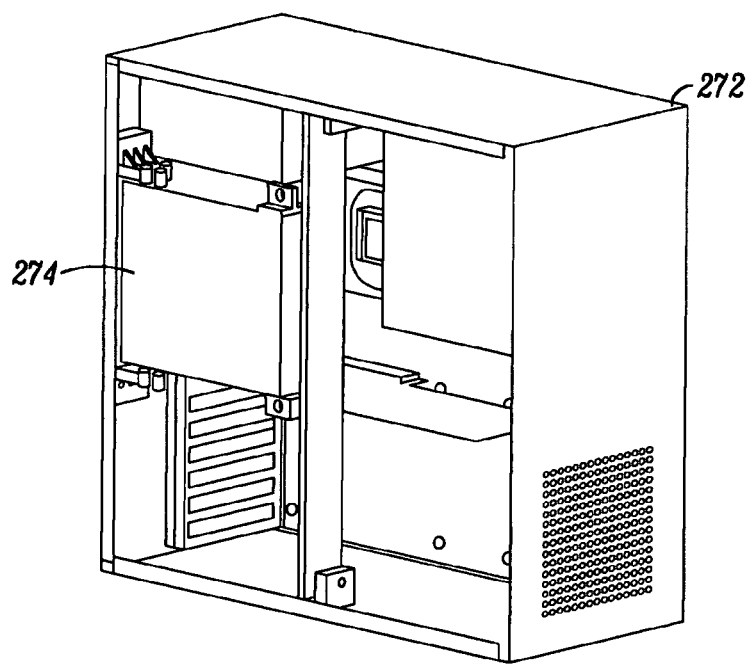
FIG. 28 is another perspective view of the electronic system from FIG. 27, with the liquid cooling unit in a closed position, in accordance with some embodiments of the invention.
Figure 29:
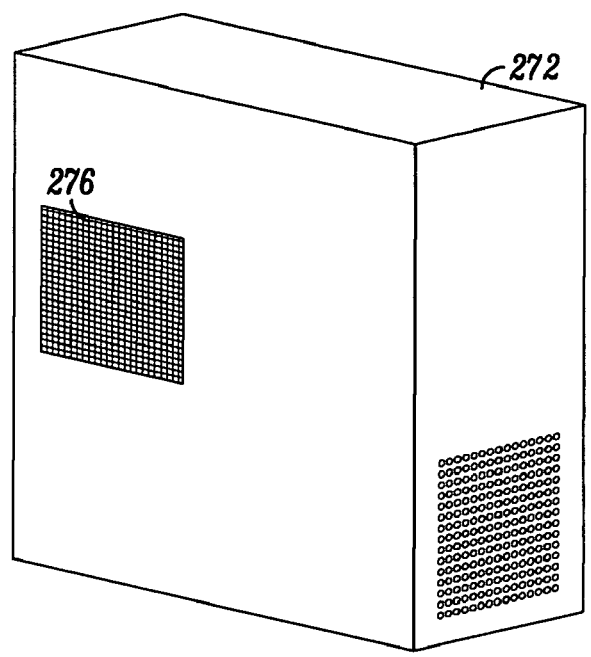
FIG. 29 is another perspective view of the electronic system from FIG. 27, including a cover panel.

With reference to FIGS. 27-29, an electronic system 270 includes a chassis 272 in a vertical configuration and a cooling device 274 which may be mounted in a horizontal position to a portion of the chassis 272. The cooling device 274 may be releasably and pivotably attached to the chassis 272 in at least an open position (e.g. see FIG. 27), to permit access to components within the electronic system 270, and a closed position (see FIG. 28), to permit installation of a cover 276 on the chassis 272. Other orientations between horizontal and vertical are also possible for either of the chassis and the cooling unit, with appropriate positioning pins, lock members, and mounting blocks to temporarily secure the cooling unit in the open position.

Figure 30:
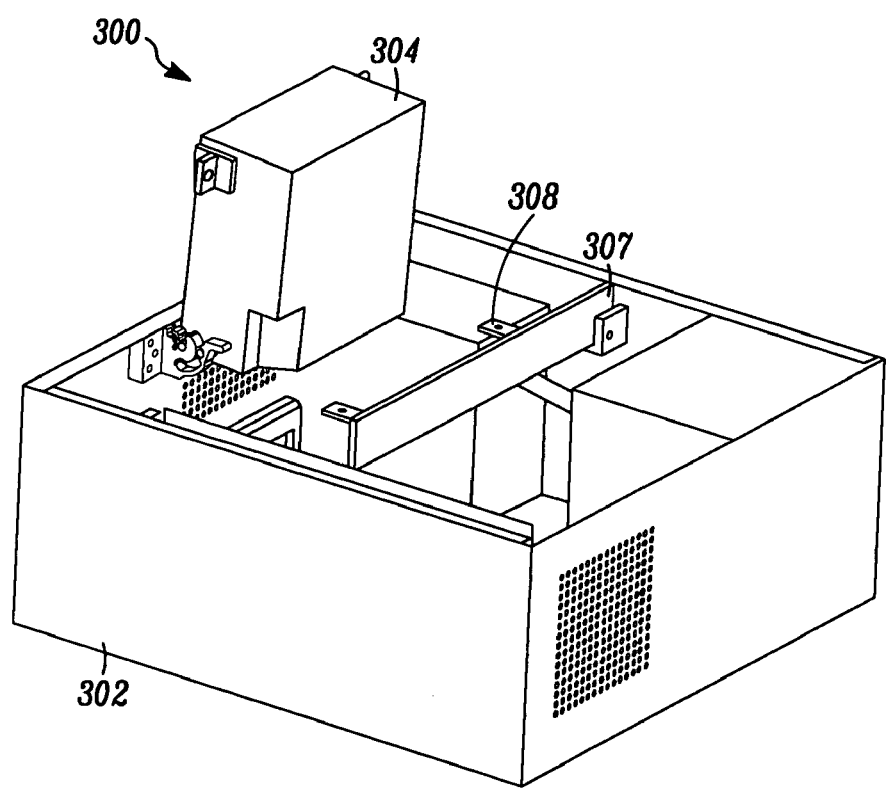
FIG. 30 is a perspective view of another electronic system, with a liquid cooling unit in an open position, in accordance with some embodiments of the invention.

With reference to FIG. 30, an electronic system 300 includes a chassis 302 and a cooling device 304 which may be mounted to a portion of the chassis 302. The cooling device 304 may be releasably and pivotably attached to the chassis 302 in at least an open position, to permit access to components within the chassis 302, and a closed position, to permit installation of a cover on the chassis 302. The chassis 302 further includes a cantilever beam 307 attached to a panel of the chassis 302 and having at least one blocking member 308 which cooperates with corresponding features on the cooling unit 304 to inhibit the cooling unit 304 from moving beyond the closed position.

Figure 31:
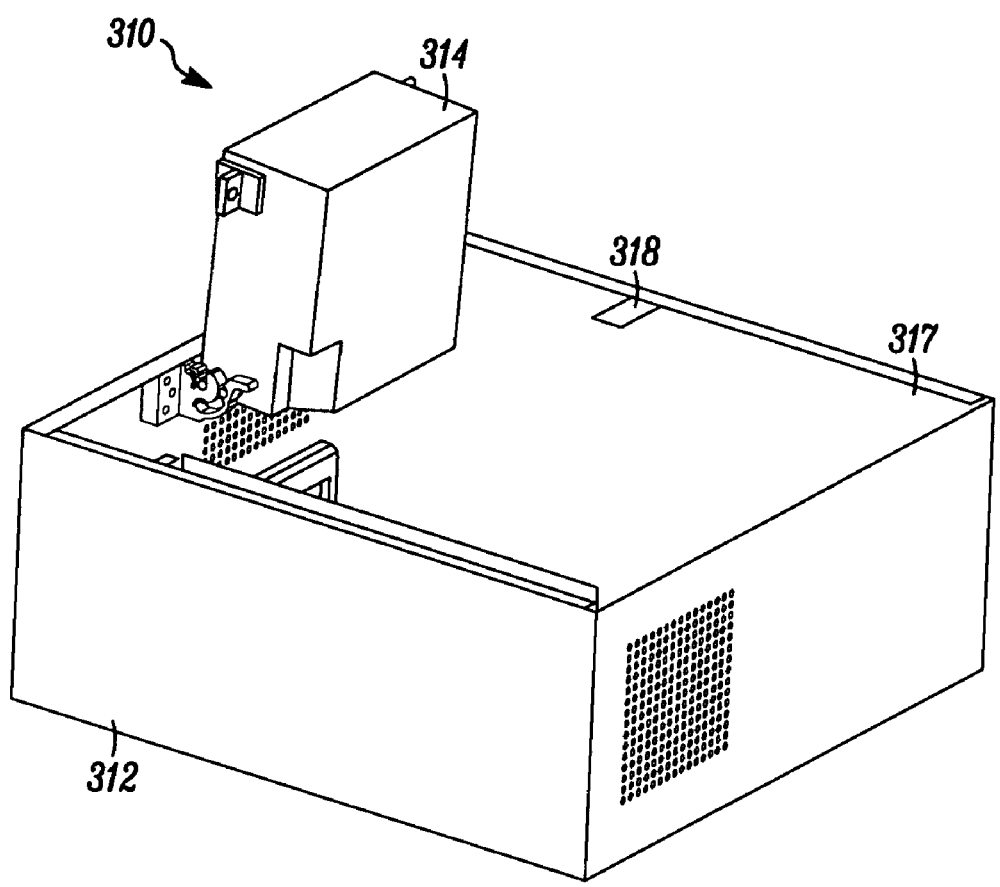
FIG. 31 is a perspective view of another electronic system, with a liquid cooling unit in an open position, in accordance with some embodiments of the invention.

With reference to FIG. 31, an electronic system 310 includes a chassis 312 and a cooling device 314 which may be mounted to a portion of the chassis 312. The cooling device 314 may be releasably and pivotably attached to the chassis 312 in at least an open position, to permit access to components within the chassis 312, and a closed position, to permit installation of a cover on the chassis 312. The chassis 312 further includes a side panel 317 having at least one blocking member 318 on the side panel 317 which cooperates with corresponding features on the cooling unit 314 to inhibit the cooling unit 314 from moving beyond the closed position.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A system, comprising:
  a chassis;
  a pair of mounting blocks disposed on a side panel of the chassis;
  at least one lock member disposed on the housing; and
  a heat exchanger assembly mounted on the chassis, the heat exchanger assembly comprises:
    a heat exchanger;
    a housing for the heat exchanger; and
    positioning pins disposed on the housing for positioning the housing on the chassis during assembly;
  wherein the mounting blocks are adapted to receive the positioning pins of the heat exchanger assembly, and
  the mounting blocks are adapted to engage the at least one lock member to temporarily secure the heat exchanger assembly in an open position.

2. The system of claim 1, wherein each mounting block comprises:
  a first channel adapted to receive one of the positioning pins; and
  a second channel adapted to receive the at least one lock member.

3. The system of claim 1, wherein the heat exchanger assembly further comprises:
  a stop member disposed on the housing and positioned to cooperate with a corresponding feature on the chassis inhibit movement of the heat exchanger assembly beyond a closed position.

4. The system of claim 3, wherein the chassis further comprises:
  a cross beam positioned between opposed panels of the chassis; and
  a blocking member disposed on the cross beam and positioned to block the stop member from moving beyond the closed position when the heat exchanger assembly is moved from the open position to the closed position.

5. The system of claim 3, wherein the chassis further comprises:
  a cantilever beam attached to a panel of the chassis; and
  a blocking member disposed on the cantilever beam and positioned to block the stop member from moving beyond the closed position when the heat exchanger assembly is moved from the open position to the closed position.

6. The system of claim 3, wherein the chassis further comprises:
a blocking member disposed on a panel of the chassis and positioned to block the stop member from moving beyond the closed position when the heat exchanger assembly is moved from the open position to the closed position.

7. The system of claim 1, further comprising a cold plate to be attached to an electronic device, wherein the cold plate is coupled to the heat exchanger assembly.

8. The system of claim 1, further comprising a liquid cooling unit, wherein the heat exchanger is included in the liquid cooling unit.

9. The system of claim 8, wherein the housing comprises a shroud and the liquid cooling unit further comprises a fan configured to direct air through the shroud and over the heat exchanger.

10. The system of claim 1, wherein the housing comprises a shroud.

11. The system of claim 10, further comprising a fan configured to direct air through the shroud and over the heat exchanger.

12. The system of claim 1, further comprising a fan configured to direct air through the housing and over the heat exchanger.

\* \* \* \* \*